US011355392B2

(12) United States Patent
Wang et al.

(10) Patent No.: US 11,355,392 B2
(45) Date of Patent: Jun. 7, 2022

(54) CONDUCTIVE VIA OF INTEGRATED CIRCUITRY, MEMORY ARRAY COMPRISING STRINGS OF MEMORY CELLS, METHOD OF FORMING A CONDUCTIVE VIA OF INTEGRATED CIRCUITRY, AND METHOD OF FORMING A MEMORY ARRAY COMPRISING STRINGS OF MEMORY CELLS

(71) Applicant: Micron Technology, Inc., Boise, ID (US)

(72) Inventors: Yiping Wang, Boise, ID (US); Jordan D. Greenlee, Boise, ID (US); Collin Howder, Boise, ID (US)

(73) Assignee: Micron Technology, Inc, Boise, ID (US)

( * ) Notice: Subject to any disclaimer, the term of this patent is extended or adjusted under 35 U.S.C. 154(b) by 99 days.

(21) Appl. No.: 16/987,991

(22) Filed: Aug. 7, 2020

(65) Prior Publication Data

US 2022/0044965 A1 Feb. 10, 2022

(51) Int. Cl.
*H01L 21/768* (2006.01)
*H01L 23/522* (2006.01)
(Continued)

(52) U.S. Cl.
CPC .... *H01L 21/76879* (2013.01); *H01L 23/5226* (2013.01); *H01L 27/1157* (2013.01);
(Continued)

(58) Field of Classification Search
None
See application file for complete search history.

(56) References Cited

U.S. PATENT DOCUMENTS 10,262,945 B2 4/2019 Makala et al.
2017/0352669 A1 12/2017 Sharangpani et al.
(Continued)

FOREIGN PATENT DOCUMENTS

WO WO 2019/216966 11/2019

OTHER PUBLICATIONS

WO PCT/US2021/042964 Search Rep., dated Nov. 16, 2021, Micron Technology, Inc.

(Continued)

*Primary Examiner* — Hsien Ming Lee
(74) *Attorney, Agent, or Firm* — Wells St. John P.S.

(57) ABSTRACT

A method used in forming a conductive via of integrated circuitry comprises forming a lining laterally over sidewalk of an elevationally-elongated opening. The lining comprises elemental-form silicon. The elemental-form silicon of an uppermost portion of the lining is ion implanted in the elevationally-elongated opening. The ion-implanted elemental-form silicon of the uppermost portion of the lining is etched selectively relative to the elemental-form silicon of a lower portion of the lining below the uppermost portion that was not subjected to said ion implanting. The elemental-form silicon of the lower portion of the lining is reacted with a metal halide to form elemental-form metal in a lower portion of the elevationally-elongated opening that is the metal from the metal halide. Conductive material in the elevationally-elongated opening is formed atop and directly against the elemental-form metal. Other embodiments, including structure independent of method, are disclosed.

30 Claims, 8 Drawing Sheets

(51) Int. Cl.
  *H01L 27/11565* (2017.01)
  *H01L 27/11519* (2017.01)
  *H01L 27/1157* (2017.01)
  *H01L 27/11521* (2017.01)
  *H01L 27/11556* (2017.01)
  *H01L 27/11582* (2017.01)

(52) U.S. Cl.
  CPC .. *H01L 27/11519* (2013.01); *H01L 27/11521* (2013.01); *H01L 27/11556* (2013.01); *H01L 27/11565* (2013.01); *H01L 27/11582* (2013.01)

(56) References Cited

U.S. PATENT DOCUMENTS

| | | |
|---|---|---|
| 2019/0348421 A1 | 11/2019 | Lee |
| 2019/0371648 A1 | 12/2019 | Wells |
| 2019/0371815 A1 | 12/2019 | Xie et al. |
| 2021/0217694 A1* | 7/2021 | Jain ................... H01L 23/528 |

OTHER PUBLICATIONS

WO PCT/US2021/042964 Writt. Opin., dated Nov. 16, 2021, Micron Technology, Inc.

\* cited by examiner

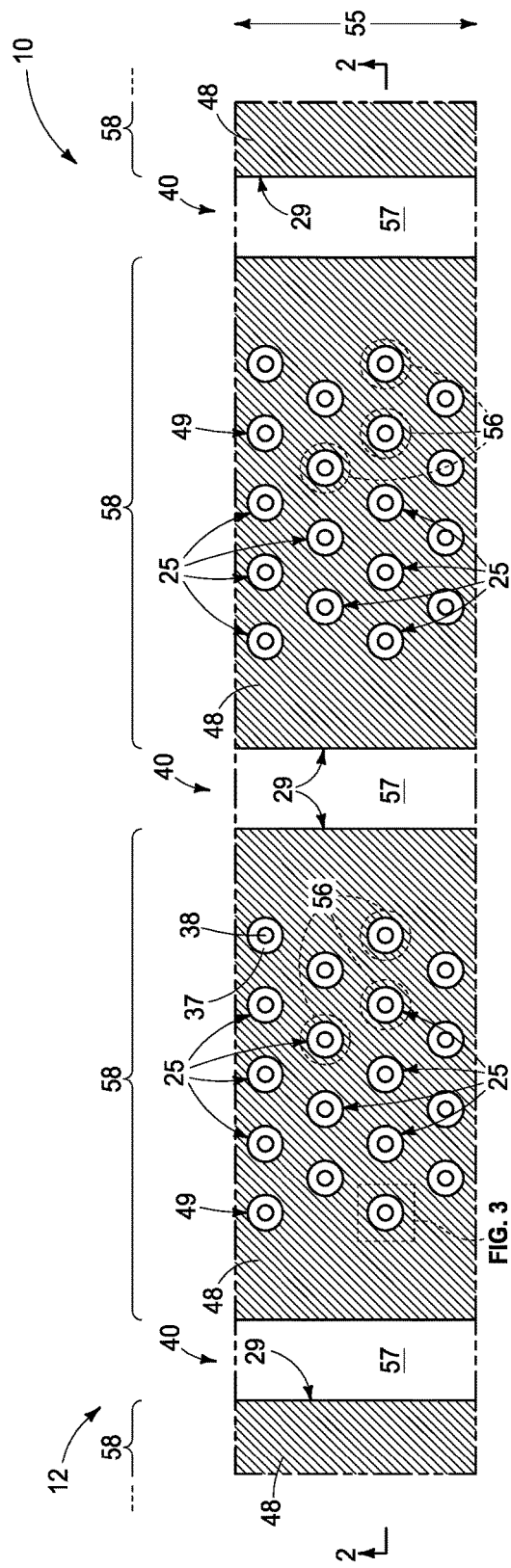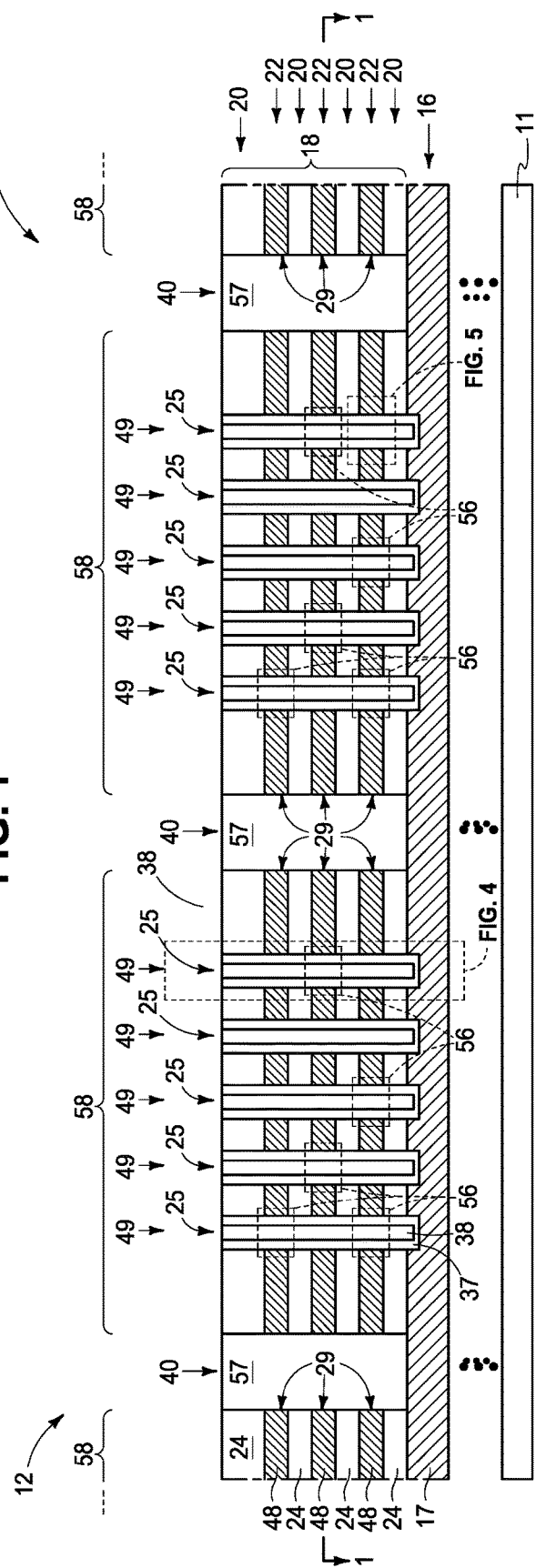

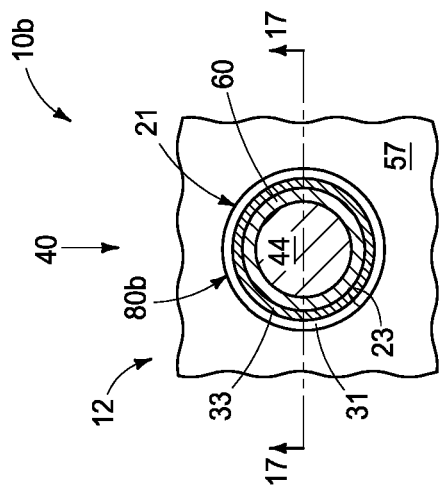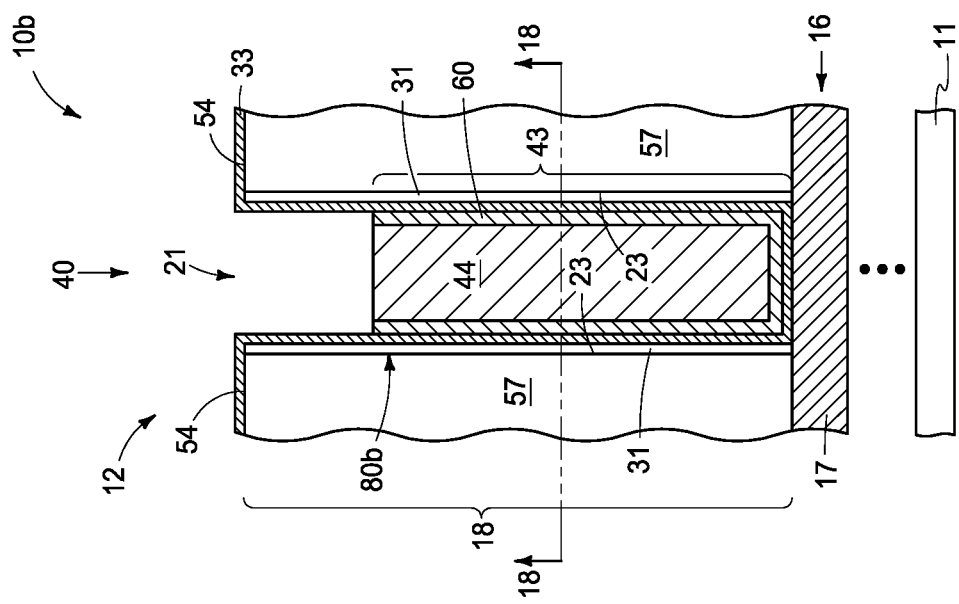

CONDUCTIVE VIA OF INTEGRATED CIRCUITRY, MEMORY ARRAY COMPRISING STRINGS OF MEMORY CELLS, METHOD OF FORMING A CONDUCTIVE VIA OF INTEGRATED CIRCUITRY, AND METHOD OF FORMING A MEMORY ARRAY COMPRISING STRINGS OF MEMORY CELLS

TECHNICAL FIELD

Embodiments disclosed herein pertain to conductive vias of integrated circuitry, to memory arrays comprising strings of memory cells, to methods of forming conductive vias of integrated circuitry, and to methods of forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 15-21 show alternate example methods and/or structural embodiments of the invention.

DETAILED DESCRIPTION OF EXAMPLE EMBODIMENTS

Figure 4:
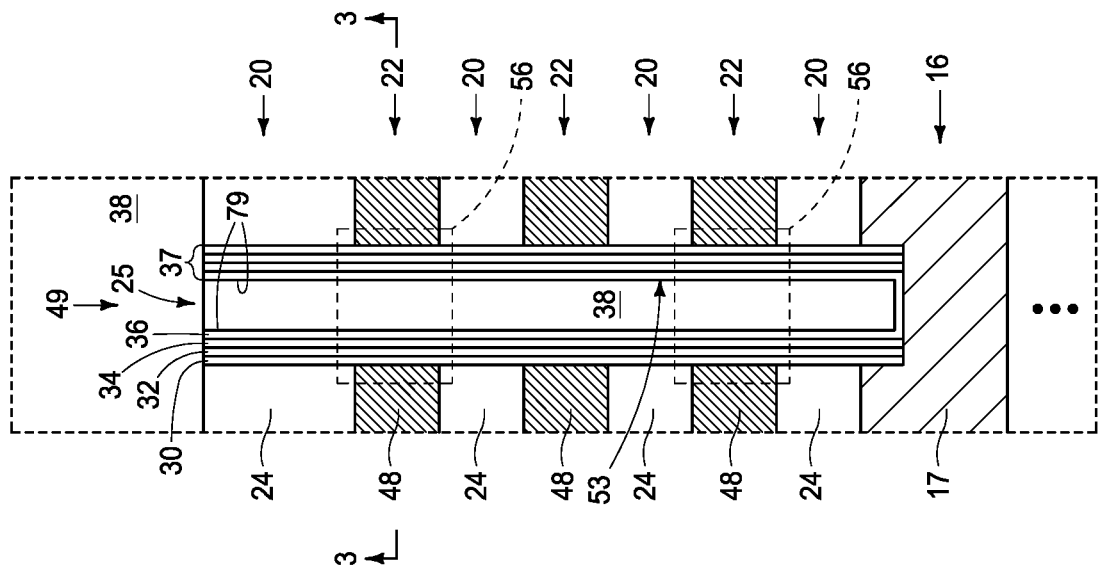
FIGS. 3-5 are enlarged views of portions of FIGS. 1 and 2.
Figure 3:
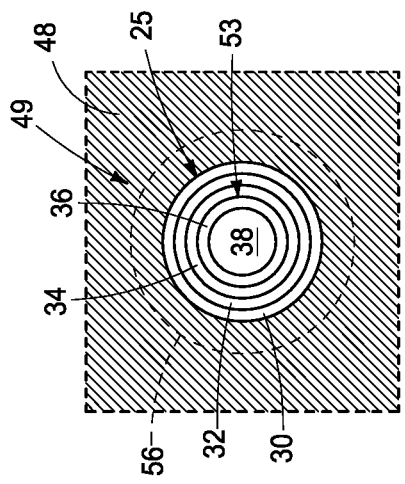
Figure 5:
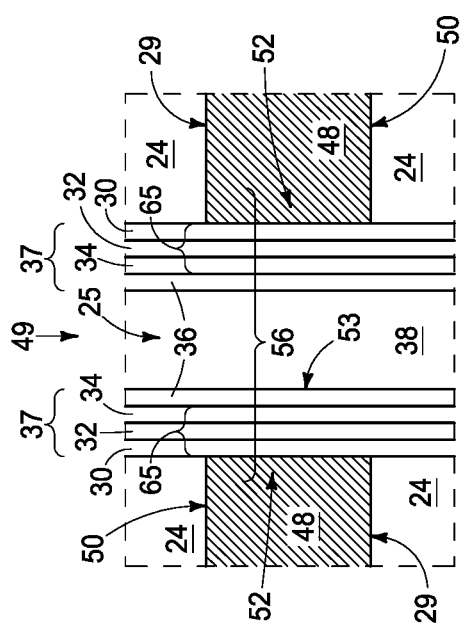

Embodiments of the invention were motivated in overcoming problems associated with forming tall conductive vias, although the invention is not so limited. For example, in the fabrication of memory circuitry as described above, conductive vias are formed to electrically couple together different electronic components that are at different elevations. As integrated circuitry has grown vertically, the height of the conductive vias has also grown vertically. It can be challenging to fill tall, high-aspect-ratio contact openings in which the conductive vias are to be received. This is particularly so where large grain size is desired of the conductive-via material and without forming void space in the conductive via. Large grain size tends to increase intrinsic conductivity. Presence of void space at best reduces conductivity and worse can lead to inoperable circuitry.

Embodiments of the invention encompass methods used in forming a memory array, for example an array of NAND or other memory cells that may have at least some peripheral control circuitry under the array (e.g., CMOS-under-array).

Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. However, the invention encompasses forming conductive vias of any existing or future-developed integrated circuitry. Embodiments of the invention also encompass a conductive via of integrated circuitry independent of method of manufacture. First example method embodiments are described with reference to FIGS. 1-14.

FIGS. 1-5 show an example construction 10 having an array 12 in which elevationally-extending strings 49 of transistors and/or memory cells 56 have been formed. Such includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11, Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. In some embodiments, conductive tiers 22 are referred to as first tiers 22 and insulative tiers 20 are referred to as second tiers 20. Example thickness for each of tiers 20 and 22 is 22 to 60 nanometers. The example uppermost tier 20 may be thicker/thickest compared to one or more other tiers 20 and/or 22. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown), Alternately or additionally, at least one of the depicted uppermost and lowest conductive tiers 22 may be a select gate tier. Example insulative tiers 20 comprise insulative material 24 (e.g., silicon dioxide and/or other material that may be of one or more composition(s)).

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory blocks 58. In this document, "block" is generic to include "sub-block". Memory blocks 58 may be considered as being longitudinally elongated and oriented, for example along a direction 55. Any alternate existing or future-developed arrangement and construction may be used.

Example memory blocks 58 are shown as at least in part having been defined by horizontally-elongated trenches 40 that were formed (e.g., by anisotropic etching) into stack 18. Trenches 40 will typically be wider than lower channel openings 25 (e.g., 10 to 20 times wider, yet such wider degree not being shown in FIGS. 1 and 2 for brevity). Trenches 40 may have respective bottoms that are directly against conductor material 17 (e.g., atop or within) of conductor tier 16 (as shown) or may have respective bottoms that are above conductor material 17 of conductor tier 16 (not shown). Intervening material 57 is in trenches 40 in stack 18 and may provide lateral electrical isolation (insulation) between immediately-laterally-adjacent memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 1-5 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprise individual operative channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown).

Example conductive tiers 22 comprise conducting material 48 that is part of individual conductive lines 29 (e.g., wordlines) that are also part of elevationally-extending strings 49 of individual transistors and/or memory cells 56. A thin insulative liner (e.g., $Al_2O_3$ and not shown) may be formed before forming conducting material 48. Approximate locations of transistors and/or memory cells 56 are indicated with a bracket in FIG. 5 and some with dashed outlines in FIGS. 1-4, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 5) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In one embodiment and as shown, channel-material strings 53 individually comprise a cylindrical shell, with storage material (e.g., 32) being radially outside such cylindrical shell. Alternately, and by way of example only, the channel-material strings may be solid pillars of channel material radially completely there-across (not shown). In the example embodiment, insulator material 38 (e.g., spin-on-dielectric, silicon dioxide, and/or silicon nitride) has been deposited atop uppermost second tier 20 and radially inside of the cylindrical shells of channel-material strings 53.

The discussion proceeds with respect to fabrication of a conductive via for and in the example integrated circuitry as described above and regardless of when the conductive via is formed. In this particular example, the conductive via formed will comprise a through-array-via (TAV) that extends through stack 18. The discussion proceeds with fabrication of a single TAV although more likely multiple TAV's would be formed simultaneously. Further, such TAV's would likely be formed in different regions of the substrate construction, for example in stair-step regions through stairs formed therein and/or through crests and/or through landings of or between stair-step structures. Further, conductive vias in accordance with embodiments of the invention may be formed as other than TAV's in the described circuitry, for example as conductive vias making direct electrical contact with conductive portions of individual stairs of stair-step structures (e.g., not extending completely through stack 18). Further as stated above, method and structural embodiments of the invention comprise forming conductive vias and conductive vias independent of method in any other existing or future-developed integrated circuitry.

Figure 7:
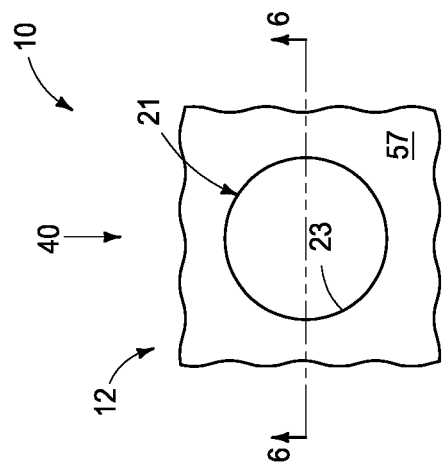
FIGS. 6-14 are diagrammatic sequential sectional, expanded, enlarged, and/or partial views of the construction of FIGS. 1-5, or portions thereof, in process in accordance with some embodiments of the invention.
Figure 6:
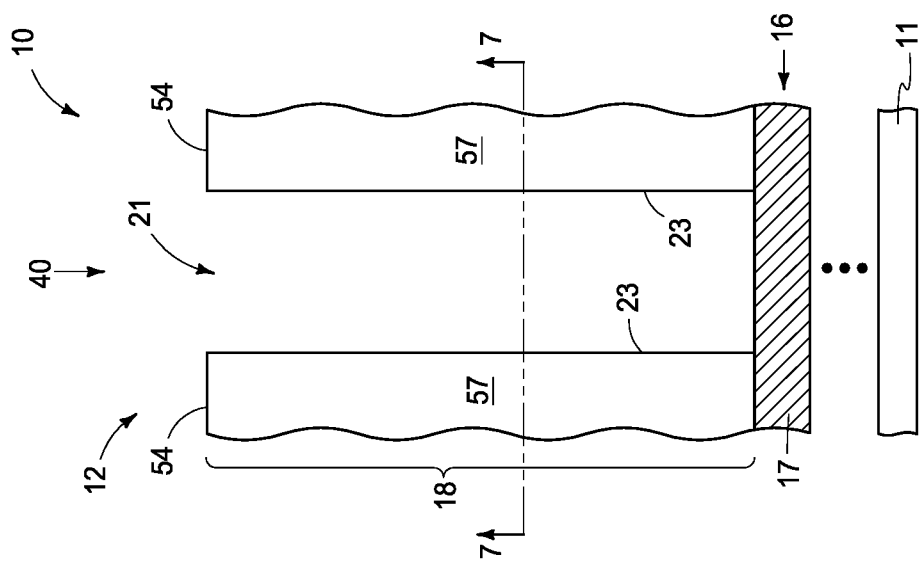

Referring to FIGS. 6 and 7, such show an enlarged portion of only a small part of a trench 40 having intervening material 57 therein. An elevationally-elongated opening 21 has been formed there-through to conductor tier 16. As stated above, trenches 40 would typically be on the order of 10 to 20 times as wide as channel openings 25 which is not shown in FIGS. 1-5 for brevity in the drawings. Opening 21, by way of example only, may have a diameter about one to four times the diameter of channel openings 25. Opening 21 may be considered as having sidewalk 23. Opening 21 in one embodiment is formed at least partially through stack 18 and in one such embodiment and as shown is formed through stack 18. Intervening material 57 may be considered as comprising a top surface 54 radially outside of opening 21.

Figure 9:
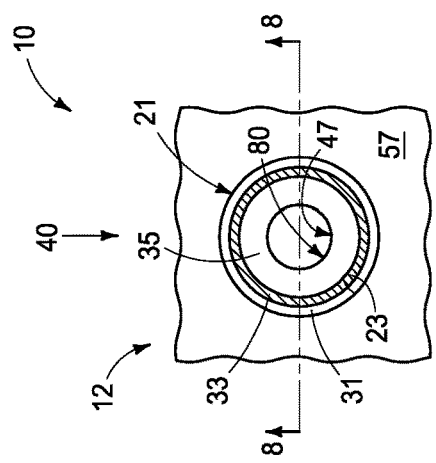
Figure 8:
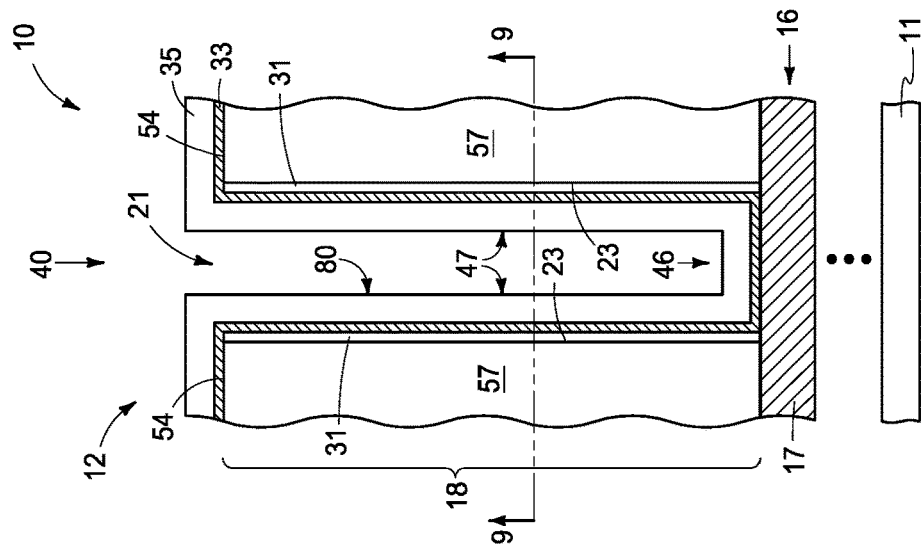

Referring to FIGS. 8 and 9, a lining 80 has been formed laterally over sidewalls 23 of opening 21. Lining 80 comprises elemental-form silicon 35, for example in one or more of polycrystalline, monocrystal line, and/or amorphous forms. In one embodiment and as shown, lining 80 comprises metal material 33 (e.g., TiN) radially-outward of elemental-form silicon 35 and in one embodiment comprises insulator material 31 (e.g., SiO$_2$ and/or Si$_3$N$_4$) radially-outward of metal material 33. Insulator material 31 may be provided to shield/insulate the conductive via being formed from shorting with conductive material (e.g., 48) in other portions of construction 10 than is shown where opening 21 passes through conductive material (not shown). By way of example, insulator material 31 may be deposited as a thin layer to line opening 21 and thereafter be subjected to a maskless anisotropic spacer-like etch to substantially remove such from being over horizontal surfaces, thereby exposing conductor material 17 of conductor tier 16. Regardless and in one embodiment as shown, elemental-form silicon 35 has been formed centrally over a bottom of opening 21 whereby lining 80 as initially-formed is of an upwardly-open container shape. Thereby, lining 80 has a container bottom 46 received radially-inward of container sidewalls 47, with container bottom 46 comprising elemental-form silicon 35. Regardless and in one embodiment and as shown, lining 80 has been formed radially-outside of opening 21 over top surface 54 of material 57 in which opening 21 is received.

Figure 10:
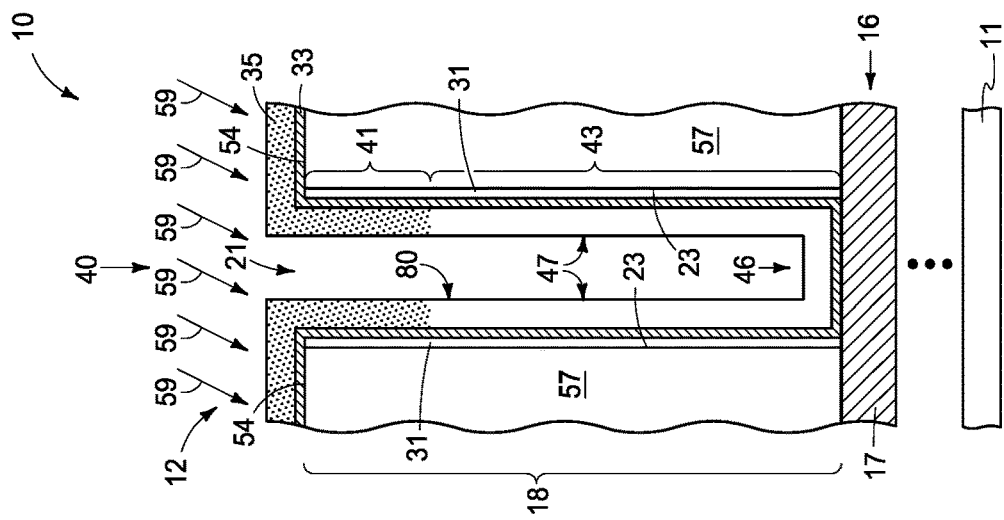

Referring to FIG. 10, elemental-form silicon 35 of an uppermost portion 41 of lining 80 has been ion implanted (indicating by stippling in elemental-form silicon 35) in opening 21. Elemental-form silicon 35 of a lower portion 43 below uppermost portion 41 has not been subjected to such ion implanting in the depicted example. Uppermost portion 41 and lower portion 43 may be of different heights relative one another (as shown) or may be of the same height relative one another (not shown) in opening 21. Such in part may depend upon, for example, dose and energy of the ion implanting and whether such ion implanting is vertical or at an angle from vertical. FIG. 10 shows an example embodiment wherein the ion implanting is at an angle from vertical (indicated by arrows 59) such that none of elemental-form silicon 35 of lower portion 43 (e.g., none of container bottom 46 of elemental-form silicon 35) is subjected to such ion implanting. Regardless, in one embodiment and as shown, the ion implanting has occurred into elemental-form silicon 35 of lining 80 that is radially-outside of opening 21. Regardless, the ion implanting ideally causes sufficient crystal lattice damage and a degree of amorphization to the elemental-form silicon while not making the elemental-form silicon more chemically Internet. In one embodiment, the ion implanting is from at least one of As, Ge, Ar, In, Sb, and BF$_2$.

Figure 11:
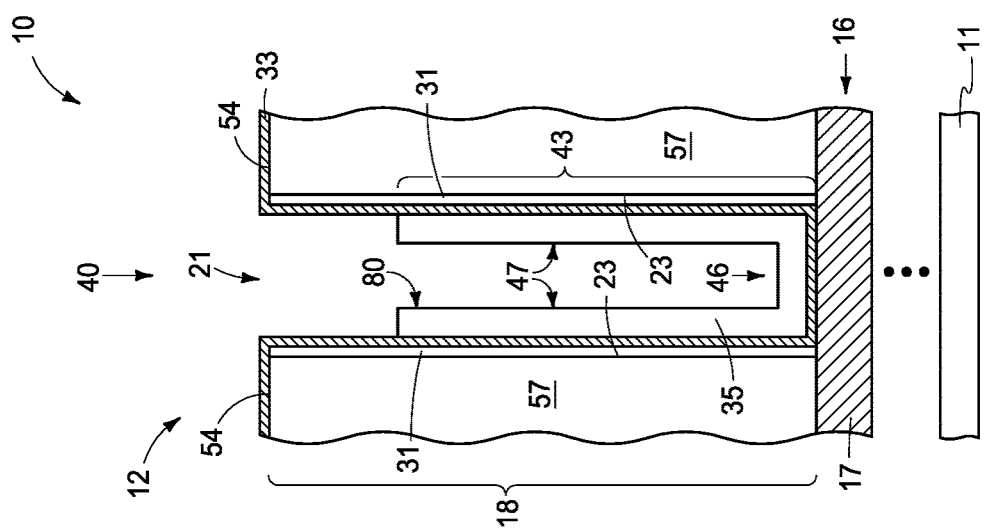

Referring to FIG. 11, ion-implanted elemental-form silicon 35 of uppermost portion 41 (not shown) of lining 80 has been etched selectively relative to elemental-form silicon 35 of lower portion 43 of lining 80 that was not subjected to such ion implanting. In one embodiment, the etching comprises use of H$_3$PO$_4$ (e.g., at 100° C. to 200° C. and at room pressure). Further in one embodiment and as shown, such etching has removed elemental-form silicon 35 of that portion (not shown) of lining 80 that is radially-outside of opening 21 atop stack 18.

Figure 13:
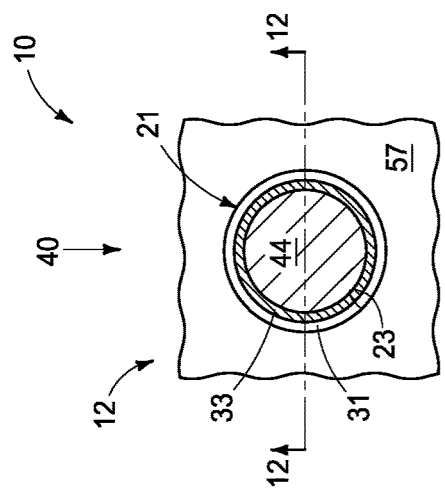
Figure 12:
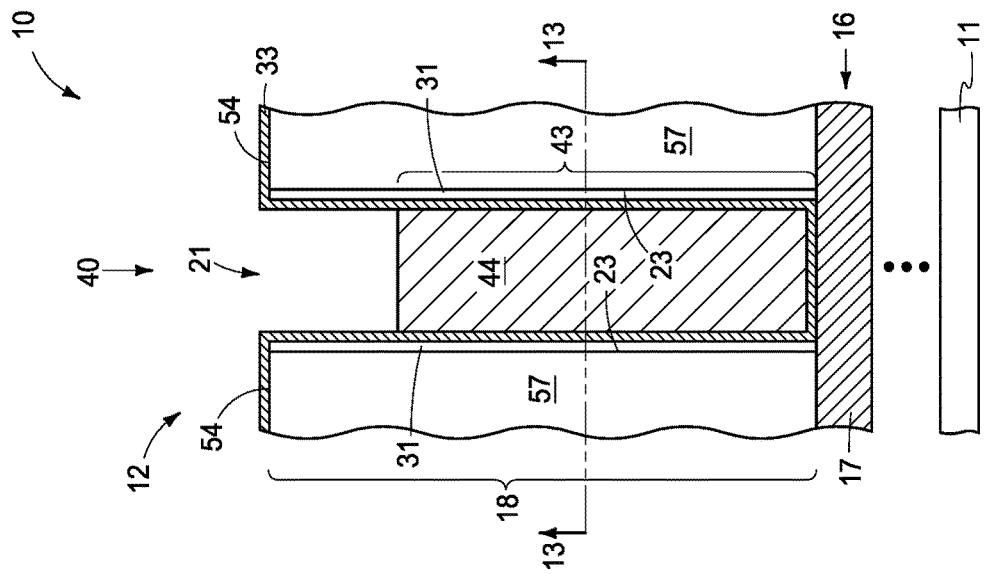

Referring to FIGS. 12 and 13, elemental-form silicon 35 (not shown) of lower portion 43 of lining 80 has been reacted with a metal halide to form elemental-form metal 44 in a lower portion (e.g., 43) of opening 21, with elemental-form metal 44 being the metal (i.e., the metal element[s]) from the metal halide. For example, the metal halide can react with the elemental-form silicon to form a gaseous silicon halide, leaving solid elemental-form metal 44 behind. Little if any (none being shown) elemental-form metal 44 will form above the elemental-form silicon. Regardless, in one embodiment the metal halide is at least one of a fluoride and a chloride and in one embodiment the metal is at least one of W, Mo, Nb, Ni, Co, and Ta. In one embodiment, the metal halide comprises WF$_6$ and the elemental-form metal is W. Exposure of the elemental-form silicon to the metal halide may occur in any suitable furnace or other processor, and with or without use of plasma. As but one example, conditions include a substate temperature of from 150° C. to 500° C. and pressure from 1 mTorr to 100 Torr.

Figure 14:
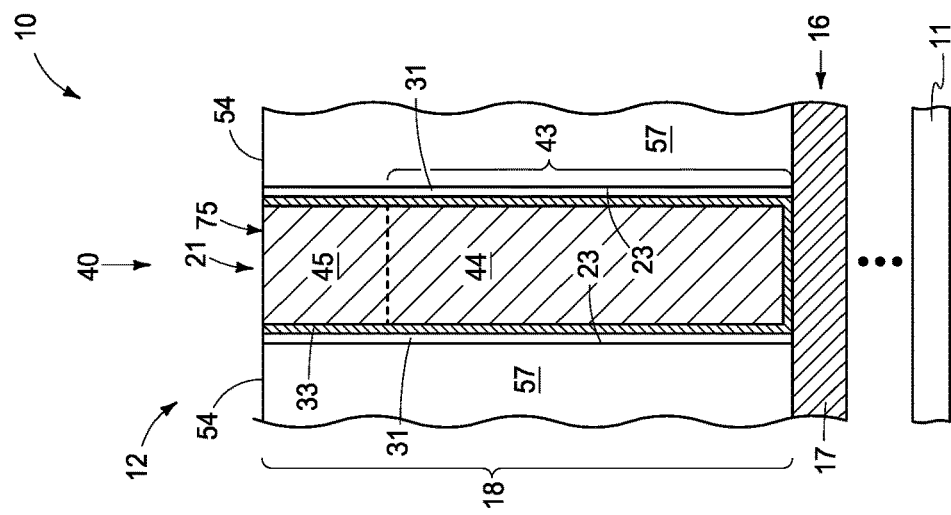

Conductive material is formed in opening 21 atop and directly against elemental-form metal 44. Such may occur by any existing or future-developed manners, for example by chemical vapor deposition, atomic layer deposition, sputtering, etc. including any combinations thereof. FIG. 14 shows subsequent formation of conductive material 45 in opening 21 atop and directly against elemental-form metal 44. Such may be initially deposited to overfill remaining volume of opening 21 and atop stack 18 outside of opening 21, followed by polishing such back at least to the top surface of stack 18, thus forming conductive via/TAV 75.

In one embodiment, conductive material 45 comprises metal material that is directly against elemental-form metal 44 and in one embodiment metal material 45 is the elemental-form metal (for example as is intended to be shown by a dashed-line interface between materials 44 & 45). In one embodiment, elemental-form metal 44 in lower portion 43 of opening 21 and the elemental-form metal of conductive material 45 are crystalline and are of different crystalline phases relative one another. For example, elemental-form W can be in alpha phase or beta phase. Reacting elemental-form silicon with a metal halide as described above will form beta phase W whereas chemical vapor deposition, for example, tends to form alpha phase W. Accordingly, and regardless, a conductive via may be fabricated that has different upper and lower crystalline phases, for example to achieve different conductive or other attributes of the finished conductive via.

Any other attribute(s) or aspect(s) as shown and/or described herein with respect to other embodiments may be used in the embodiments shown and described with reference to the above embodiments.

Figure 15:
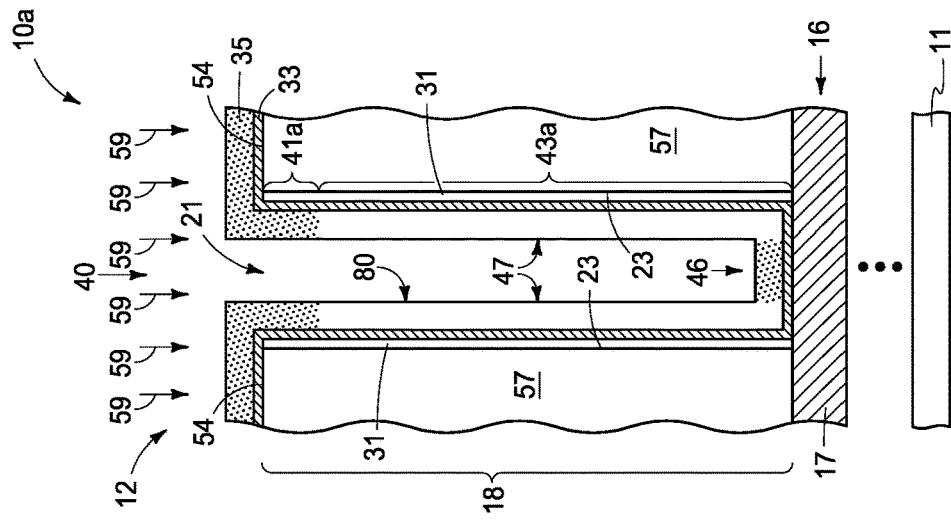

Alternate example processing to that described above is next described with reference to FIGS. 15 and 16. Like numerals from the above-described embodiments have been used where appropriate, with some construction differences being indicated with a suffix "a" or with different numerals. Referring first to FIG. 15, such corresponds in processing sequence to that shown by FIG. 10. Here, ion implanting (indicated by vertical arrows 59) has been conducted vertically whereby such ion implanting has also occurred into elemental-form silicon 35 of container bottom 46 of lower portion 43*a* of lining 80 as well as into uppermost portion 41*a*. Depth of ion implanted uppermost portion 41*a* in construction 10*a* may not be as great as ion implanted uppermost portion 41 in construction 10.

Figure 16:
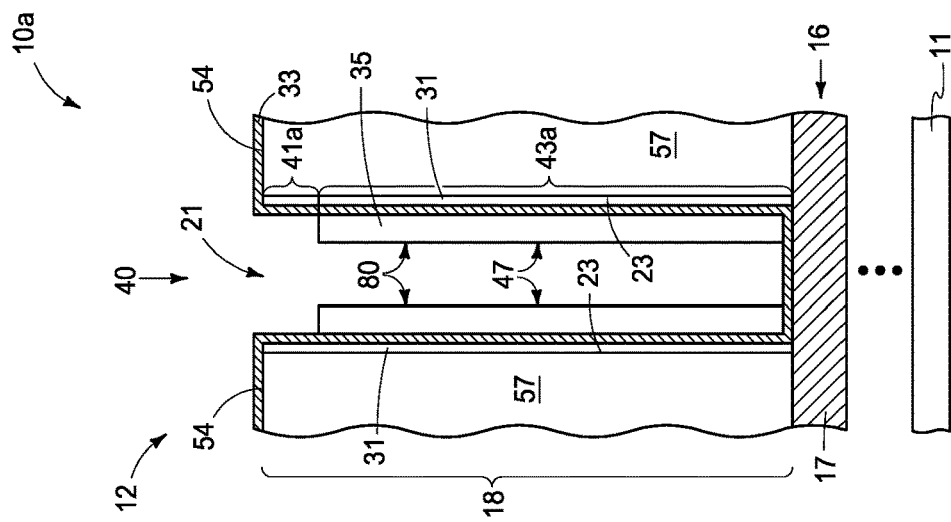

Referring to FIG. 16, ion implanted container bottom 46 (not shown) has been etched away when etching ion-implanted elemental-form silicon 35 of uppermost portion 41*a* of lining 80. Processing may occur subsequently as described above.

Any other attribute(s) or aspect(s) as shown and/or described herein with respect to other embodiments may be used.

Figure 19:
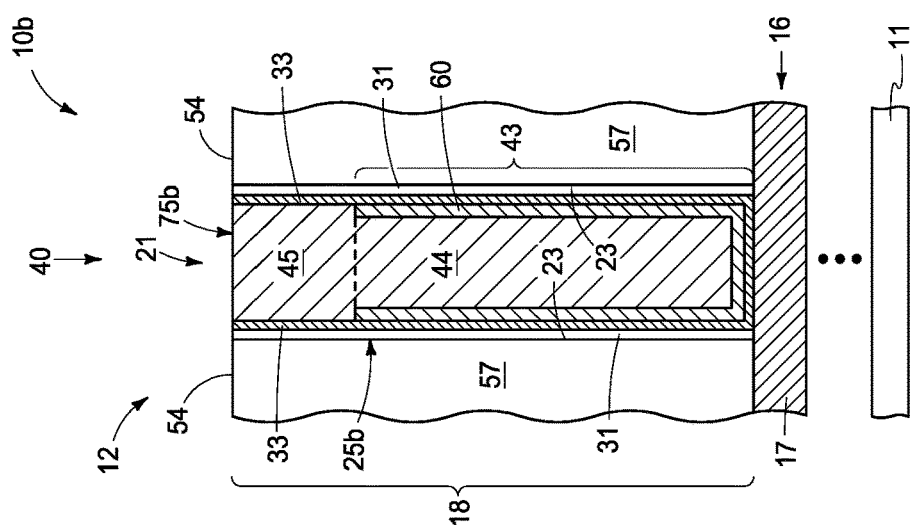

Another alternate example embodiment is described with reference to FIGS. 17-19 in a construction 10b. Like numerals from the above-described embodiments have been used where appropriate, with some construction differences being indicated with the suffix "b" or with different numerals. FIGS. 17 and 18 show alternate processing to that shown by FIGS. 12 and 13. Here, lining 80b after the reacting with the metal halide comprises a metal silicide 60 radially-outward and directly against elemental-form metal 44, with the metal of metal silicide 60 being the metal (i.e., the metal element[s]) from the metal halide. In one such embodiment and as shown, lining 80b after the reacting comprises a metal silicide 60 that is sandwiched radially-between metal material 33 and elemental-form metal 44. FIG. 19 shows subsequent processing corresponding to that of FIG. 14, resulting in conductive via/TAV 75h. Any other attribute(s) or aspect(s) as shown and/or described herein with respect to other embodiments may be used.

Figure 21:
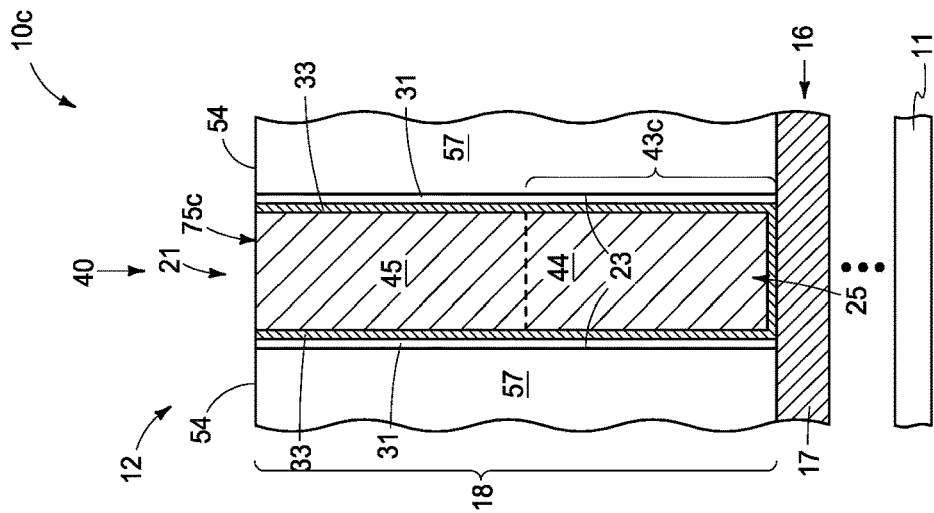
Figure 20:
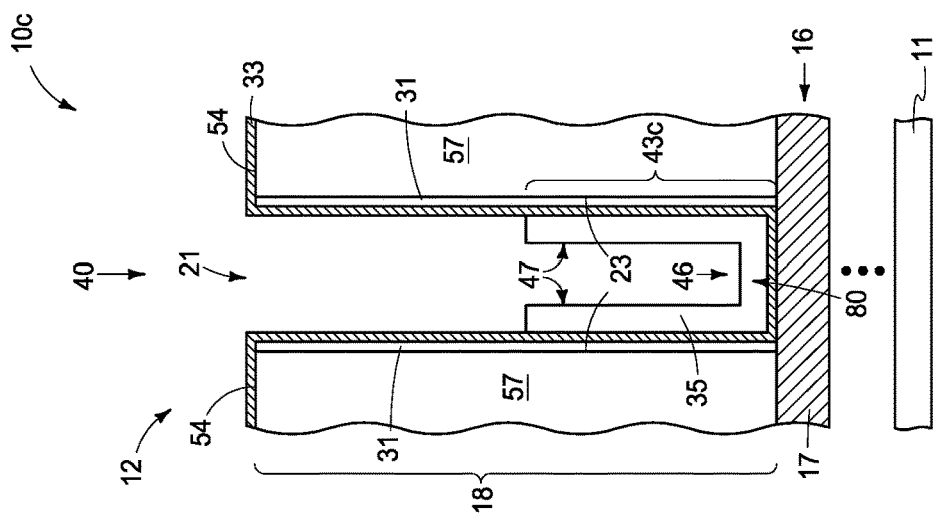

FIGS. 20 and 21 show processing relative to an alternate embodiment described with respect to a construction 10c. Like numerals from the above-described embodiments have been used where appropriate, with some construction differences being indicated with a suffix "c" or with different numerals. FIG. 20 shows a processing step immediately-subsequent to that shown by FIG. 8 (or by FIG. 10 or 15). Here, ion implanting may not have been conducted into uppermost portion 41/41a (not shown) of lining 80 and, rather, in one embodiment, elemental-form silicon of the uppermost portion and of the lower portion of lining 80 (e.g., as shown in FIG. 8) are of the same composition relative one another. FIG. 20 shows that the elemental-form silicon of the uppermost portion has been subjected to a non-selective etching relative to the elemental-form silicon of the lower portion 43c of lining 80. Such may remove container bottom 46 (not shown) or may not remove container bottom 46 (as shown), for example depending upon etching technique that is used. For example, conventional wet isotropic or anisotropic etching of elemental-form silicon 35 would likely remove container bottom 46. Alternately, by way of example, a no-bias etch using a fluorine radical (e.g., pressure from 1 mTorr to 10 Torr, temperature from 200° C. to °500 C.) may have the effect of etching sidewalls of the example container-shape without etching the bottom thereof. Fluorine radicals can be generated in such instance, for example, from any one or more of $CF_4$, $NF_3$, $BF_3$, and $F_2$. FIG. 21 shows subsequent processing corresponding to that through FIG. 14, resulting in conductive via/TAV 75c. Any other attribute(s) or aspect(s) as shown and/or described herein with respect to other embodiments may be used.

Alternately or additionally considered, the above embodiments show vertical recessing of the elemental-form silicon of an uppermost portion of the lining in opening 21 relative to elemental-form silicon of a lower portion of the lining that is below the uppermost portion. In one such embodiment, the elemental-form silicon of the uppermost portion and the elemental-form silicon of the lower portion of lining 80 are of different compositions relative one another (e.g., FIGS. 10 and 15), and the vertical recessing comprises etching the elemental-form silicon of the uppermost portion of the lining selectively relative to the elemental-form silicon of the lower portion of the lining. In one such embodiment, the different compositions result from changing composition of the elemental-form silicon of the uppermost portion of the lining after it has been formed (e.g., by ion implanting). Alternately, the different compositions may result from changing deposition conditions (e.g., modifying type or quantity of feed gasses) during a deposition of the elemental-form silicon of the uppermost portion of the lining. Any other attribute(s) or aspect(s) as shown and/or described herein with respect to other embodiments may be used.

Alternate embodiment constructions may result from method embodiments described above, or otherwise. Regardless, embodiments of the invention encompass conductive vias of integrated circuitry and memory arrays independent of method of manufacture. Nevertheless, such conductive vias and memory arrays may have any of the attributes as described herein in method embodiments. Likewise, the above-described method embodiments may incorporate, form, and/or have any of the attributes described with respect to device embodiments.

In one embodiment, a conductive via (e.g., 75, 75a, 75b, of integrated circuitry comprises elevationally-elongated metal material (e.g., 44, 45, 60, 33) that is crystalline. The elevationally-elongated crystalline metal material comprises an upper portion directly above and directly against a lower portion, with the upper portion and the lower portion comprising different crystalline phases relative one another. Any other attribute(s) or aspect(s) as shown and/or described herein with respect to other embodiments may be used.

In one embodiment, a conductive via (e.g., 75b) of integrated circuitry comprises elevationally-elongated metal material (e.g., 44, 45, 60, 33). The elevationally-elongated metal material comprises an upper portion directly above and directly against a lower portion. The lower portion comprises a radially-outer portion (e.g., 60) comprising a metal silicide and a radially-innermost portion (e.g., 44) comprising elemental-form metal that is the same metal as that of the metal silicide. In one embodiment, the elevationally-elongated metal material of the upper portion and of the lower portion are crystalline and of different crystalline phases relative one another. Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18) comprising alternating insulative tiers (e.g., 20) and conductive tiers (e.g., 22). Channel-material strings (e.g., 53) of memory cells (e.g., 56) extend through the insulative tiers and the conductive tiers. A conductive via (e.g., 75, 75a, 75b, 75c) extends through at least some of the insulative and conductive tiers. The conductive via comprises elevationally-elongated metal material (e.g., 44, 45, 60, 33) that is crystalline. The elevationally-elongated crystalline metal material comprises an upper portion directly above and directly against a lower portion, with the upper portion and the lower portion comprising different crystalline phases relative one another. Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18) comprising alternating insulative tiers (e.g., 20) and conductive tiers (e.g., 22). Channel-material strings (e.g., 53) of memory cells (e.g., 56) extend through the insulative tiers and the conductive tiers. A conductive via (e.g., 75b) extends through at least some of the insulative and conductive tiers. The conductive via comprises elevationally-elongated metal material (e.g., 44, 45, 60, 33) comprising an upper portion directly above and directly against a lower portion. The lower portion comprises a radially-outer portion (e.g., 60) comprising a metal silicide and a radially-innermost portion (e.g., 44) comprising elemental-form metal that is the same metal as that of the metal silicide. In one embodiment, the elevationally-elongated metal material of the upper portion and of the lower portion are crystalline and of different crystalline phases relative one another. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a conductive via of integrated circuitry comprises forming a lining laterally over sidewalls of an elevationally-elongated opening. The lining comprises elemental-form silicon. The elemental-form silicon of an uppermost portion of the lining is ion implanted in the elevationally-elongated opening. The ion-implanted elemental-form silicon of the uppermost portion of the lining is etched selectively relative to the elemental-form silicon of a lower portion of the lining below the uppermost portion that was not subjected to said ion implanting. The elemental-form silicon of the lower portion of the lining is reacted with a metal halide to form elemental-form metal in a lower portion of the elevationally-elongated opening that is the metal from the metal halide. Conductive material in the elevationally-elongated opening is formed atop and directly against the elemental-form metal.

In some embodiments, a method used in forming a conductive via of integrated circuitry comprises forming a lining laterally over sidewalls of an elevationally-elongated opening. The lining comprises elemental-form silicon. The elemental-form silicon of an uppermost portion of the lining in the elevationally-elongated opening is vertically-recessed relative to the elemental-form silicon of a lower portion of the lining that is below the uppermost portion. The elemental-form silicon of the lower portion of the lining is reacted with a metal halide to form elemental-form metal in a lower portion of the elevationally-elongated opening that is the metal from the metal halide. Conductive material in the elevationally-elongated opening is formed atop and directly against the elemental-form metal In some embodiments, a conductive via of integrated circuitry comprises devotionally-elongated metal material that is crystalline. The elevationally-elongated crystalline metal material comprises an upper portion directly above and directly against a lower portion. The upper portion and the lower portion comprise different crystalline phases relative one another.

In some embodiments, a conductive via of integrated circuitry comprises elevationally-elongated metal material. The elevationally-elongated metal material comprises an upper portion directly above and directly against a lower portion. The lower portion comprises a radially-outer portion that comprises a metal silicide. A radially-innermost portion comprises elemental-form metal that is the same metal as that of the metal silicide.

In some embodiments, a memory array comprising strings of memory cells comprises laterally-spaced memory blocks individually comprising a vertical stack that comprises alternating insulative tiers and conductive tiers. Channel-material strings of memory cells extend through the insulative tiers and the conductive tiers. A conductive via extends through at least some of the insulative and conductive tiers. The conductive via comprises elevationally-elongated metal material that is crystalline. The elevationally-elongated crystalline metal material comprises an upper portion directly above and directly against a lower portion. The upper portion and the lower portion comprise different crystalline phases relative one another.

In some embodiments, a memory array comprising strings of memory cells comprises laterally-spaced memory blocks individually comprising a vertical stack that comprises alternating insulative tiers and conductive tiers. Channel-material strings of memory cells extend through the insulative tiers and the conductive tiers. A conductive via extends through at least some of the insulative and conductive tiers. The conductive via comprising elevationally-elongated metal material comprises an upper portion directly above and directly against a lower portion. The lower portion comprises a radially-outer portion that comprises a metal silicide. A radially-innermost portion comprises elemental-form metal that is the same metal as that of the metal silicide.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a conductive via of integrated circuitry, comprising:
   forming a lining laterally over sidewalls of an elevationally-elongated opening, the lining comprising elemental-form silicon;
   ion implanting the elemental-form silicon of an uppermost portion of the lining in the elevationally-elongated opening;
   etching the ion-implanted elemental-form silicon of the uppermost portion of the lining selectively relative to the elemental-form silicon of a lower portion of the lining below the uppermost portion that was not subjected to said ion implanting;

reacting the elemental-form silicon of the lower portion of the lining with a metal halide to form elemental-form metal in a lower portion of the elevationally-elongated opening that is the metal from the metal halide; and forming conductive material in the elevationally-elongated opening atop and directly against the elemental-form metal.

2. The method of claim 1 comprising forming the elemental-form silicon centrally over a bottom of the elevationally-elongated opening whereby the lining as initially formed is of an upwardly-open container shape.

3. The method of claim 1 comprising forming the lining radially-outside of the elevationally-elongated opening over a top surface of material in which the elevationally-elongated opening is received, the ion implanting occurring into the elemental-form silicon of that portion of the lining that is radially-outside of the elevationally-elongated opening, said etching removing the elemental-form silicon of that portion of the lining that is radially-outside of the elevationally-elongated opening.

4. The method of claim 1 wherein the ion implanting is at an angle from vertical such that none of the elemental-form silicon of the lower portion is subjected to said ion implanting.

5. The method of claim 1 wherein the ion implanting is vertical.

6. The method of claim 5 comprising:
forming the elemental-form silicon centrally over a bottom of the elevationally-elongated opening whereby the lining is of an upwardly-open container shape having a container bottom received radially-inward of container sidewalls, the container bottom comprising the elemental-form silicon;
the vertical ion implanting also being into the elemental-form silicon of the container bottom of the lower portion of the lining; and
the ion-implanted container bottom being etched away when etching the ion-implanted elemental-form silicon of the uppermost portion of the lining.

7. The method of claim 1 wherein the substance is at least one of As, Ge, Ar, In, Sb, and $BF_2$.

8. The method of claim 1 wherein the etching comprises use of $H_3PO_4$.

9. The method of claim 1 wherein the metal halide is at least one of a fluoride and a chloride.

10. The method of claim 1 wherein the elemental-form metal is at least one of W, Mo, Nb, Ni, Co, and Ta.

11. The method of claim 1 wherein the metal halide comprises $WF_6$ and the elemental-form metal is W.

12. The method of claim 1 wherein the conductive material comprises metal material that is directly against the elemental-form metal.

13. The method of claim 12 wherein the metal material is the elemental-form metal.

14. The method of claim 13 wherein the elemental-form metal in the lower portion of the elevationally-elongated opening and the elemental-form metal of the conductive material are crystalline and of different crystalline phases relative one another.

15. The method of claim 1 wherein the lining after the reacting comprises a metal silicide radially-outward and directly against the elemental-form metal, the metal of the metal silicide being the metal from the metal halide.

16. The method of claim 1 wherein the lining comprises metal material radially-outward of the elemental-form silicon.

17. The method of claim 16 wherein the lining comprises insulator material radially-outward of the metal material.

18. The method of claim 17 wherein the lining after the reacting comprises a metal silicide sandwiched radially-between the metal material and the elemental-form metal, the metal of the metal silicide being the metal from the metal halide.

19. The method of claim 1 wherein the elemental-form silicon is polycrystalline.

20. The method of claim 1 wherein the elemental-form silicon is monocrystalline.

21. The method of claim 1 wherein the elemental-form silicon is amorphous.

22. The method of claim 1 comprising:
forming a memory array comprising strings of memory cells including forming a stack comprising vertically-alternating insulative tiers and conductive tiers, the memory-cell strings comprising channel-material strings in the stack; and forming the elevationally-elongated opening at least partially through the stack.

23. The method of claim 22 comprising forming the elevationally-elongated opening through the stack, the conductive via comprising a through-array-via.

24. The method of claim 22 comprising NAND.

25. A method used in forming a conductive via of integrated circuitry, comprising:
forming a lining laterally over sidewalls of an elevationally-elongated opening, the lining comprising elemental-form silicon;
vertically recessing the elemental-form silicon of an uppermost portion of the lining in the elevationally-elongated opening relative to the elemental-form silicon of a lower portion of the lining that is below the uppermost portion;
reacting the elemental-form silicon of the lower portion of the lining with a metal halide to form elemental-form metal in a lower portion of the elevationally-elongated opening that is the metal from the metal halide; and
forming conductive material in the elevationally-elongated opening atop and directly against the elemental-form metal.

26. The method of claim 25 wherein the vertical recessing comprises timed non-selective etching of the elemental-form silicon of the uppermost portion of the lining relative to the elemental-form silicon of the lower portion of the lining.

27. The method of claim 26 wherein the elemental-form silicon of the uppermost portion and the lower portion of the lining are of the same composition relative one another.

28. The method of claim 25 wherein the elemental-form silicon of the uppermost portion and the elemental-form silicon of the lower portion of the lining are of different compositions relative one another, the vertical recessing comprising etching the elemental-form silicon of the uppermost portion of the lining selectively relative to the elemental-form silicon of the lower portion of the lining.

29. The method of claim 28 wherein the different compositions result from changing deposition conditions during a deposition of the elemental-form silicon of the uppermost portion of the lining.

30. The method of claim 28 wherein the different compositions result from changing composition of the elemental-form silicon of the uppermost portion of the lining after it has been formed.

* * * * *